US009984690B1

(12) United States Patent
Shintani et al.

(10) Patent No.: US 9,984,690 B1
(45) Date of Patent: May 29, 2018

(54) MICROPHONE GAIN USING A TIME OF FLIGHT (TOF) LASER RANGE FINDING SYSTEM

(71) Applicants: SONY CORPORATION, Tokyo (JP); SONY INTERACTIVE ENTERTAINMENT INC., Tokyo (JP)

(72) Inventors: Peter Shintani, San Diego, CA (US); Morio Usami, Tokyo (JP); Keith Resch, San Diego, CA (US)

(73) Assignees: Sony Corporation, Tokyo (JP); SONY INTERACTIVE ENTERTAINMENT INC., Tokyo (JP)

( * ) Notice: Subject to any disclaimer, the term of this patent is extended or adjusted under 35 U.S.C. 154(b) by 0 days. days.

(21) Appl. No.: 15/672,522

(22) Filed: Aug. 9, 2017

(51) Int. Cl.
| | |
|---|---|
| *H03F 99/00* | (2009.01) |
| *G10L 15/26* | (2006.01) |
| *G10L 15/08* | (2006.01) |
| *G10L 15/22* | (2006.01) |
| *G06F 3/16* | (2006.01) |
| *G01S 3/80* | (2006.01) |
| *G01S 15/42* | (2006.01) |
| *G01S 13/46* | (2006.01) |
| *G01S 17/02* | (2006.01) |

(52) U.S. Cl.
CPC .......... *G10L 15/265* (2013.01); *G01S 3/8006* (2013.01); *G01S 15/42* (2013.01); *G06F 3/167* (2013.01); *G10L 15/08* (2013.01); *G10L 15/22* (2013.01); *G01S 17/023* (2013.01); *G01S 2013/468* (2013.01); *G10L 2015/223* (2013.01)

(58) Field of Classification Search
CPC ........ G06F 3/167; G01S 3/8006; G01S 15/42; G01S 17/023; G01S 2013/468; G10L 15/265; G10L 15/08; G10L 15/22; G10L 2015/223

USPC .......................................................... 381/120
See application file for complete search history.

(56) References Cited

U.S. PATENT DOCUMENTS

| 6,621,764 B1 | 9/2003 | Smith |
| 9,020,825 B1 | 4/2015 | Garber |
| 9,354,310 B2 | 5/2016 | Visser et al. |
| 2012/0224456 A1* | 9/2012 | Visser .................. G01S 3/8006 367/127 |

FOREIGN PATENT DOCUMENTS

| WO | 2012107070 A1 | 8/2012 |
| WO | 2017064367 A1 | 4/2017 |

OTHER PUBLICATIONS

Hans-Elias De Bree, Guido De Croon, "Acoustic Vector Sensors on Small Unmanned Air Vehicles", Presented at the SMi Unmanned Aircraft Systems, UK, Nov. 2011. http://microflown-avisa.com/wp-content/uploads/2014/02/Acoustic-Vector-Sensors-on-Small-Unmanned-Air-Vehicles-pdf1.pdf.

(Continued)

*Primary Examiner* — Paul S Kim
(74) *Attorney, Agent, or Firm* — John L. Rogitz

(57) ABSTRACT

Range to a human speaker is determined using a laser-based time of flight (ToF) system, with the range then being used to adjust the gain of a microphone receiving the speaker's voice. If desired, an acoustic-based Direction of Arrival (DoA) system uses acoustic information to determine the direction of incoming sound, such as a person talking, and the direction of the sound is then used to focus the area of laser illumination.

19 Claims, 9 Drawing Sheets

(56) References Cited

OTHER PUBLICATIONS

Jean-Marc Valin, Francois Michaud, Jean Rouat, Dominic Letourneau, "Robust Sound Source Localization Using a Microphone Array on a Mobile Robot", Laborius-Research Laboratory on Mobil Robotics and Intelligent Systems Department of Electrical Engineering and Computer Engineering, https://anciv.org/abs/1602.08213—Feb. 26, 2016.

Peter Shintani, Morio Usami, Keith Resch, "Improving Performance of a Time of Flight (ToF) Laser Range Finding System Using Acoustic-Based Direction of Arrival (DoA)", related pending U.S. Appl. No. 15/672,456, filed Aug. 9, 2017.

* cited by examiner

Establishing peer master (example)

Establishing peer master (example)

MICROPHONE GAIN USING A TIME OF FLIGHT (TOF) LASER RANGE FINDING SYSTEM

FIELD

The present application relates to technically inventive, non-routine solutions that are necessarily rooted in computer technology and that produce concrete technical improvements.

BACKGROUND

When multiple computerized devices interact with each other at close range, they may employ sensors such as cameras and laser range finders to map their environment. As understood herein, the use of such sensors by multiple devices can cause mutual interference due to overlapping emissions of laser illumination.

More generally, in laser range-finding systems that use time of flight (ToF) principles to find distances from an origin to various objects, for a comprehensive mapping of the environment the laser must be swept left and right and up and down to detect objects in the area and determine their ranges from the origin.

Relatedly, a difficulty in a voice recognition system is to correctly set the audio gain. If the gain is too high, distortion results or too much ambient sounds are amplified. If the gain is too low, desired sounds will not be detected.

SUMMARY

As understood herein, instead of solely relying on the voice recognition system to adapt the gain level by trying a setting, detecting speech and then either raising or lowering the gain in an iterative process, a range-finding laser is used to determine the distance to the speaker. The range is then used to establish the gain.

Accordingly, a device includes at least one computer medium that is not a transitory signal and that in turn includes instructions executable by at least one processor to receive at least a first acoustic signal from a source of sound, and to determine at least an azimuthal direction to the source of sound from an origin based at least in part on the first acoustic signal. The instructions are executable to transmit at least a first range-finding beam along the azimuthal direction determined based at least in part on the first acoustic signal to render a distance to the source of sound. The instructions are further executable to, based at least in part on the distance rendered using the range-finding beam, adjust a gain of an amplifier of an audio system.

The gain of the amplifier may be linearly correlated to the distance. Or, the gain of the amplifier may be logarithmically correlated to the distance.

The distance can be rendered based on intraocular spacing between a person's pupils as determined from a 3D map generated based on reflections of the laser range-finding beam. Or, the distance can be rendered using the laser range-finding beam is based on a time of flight (ToF) determination.

The instructions may be executable to determine, based on a texture of at least one surface, a sound absorption characteristic of the surface. The instructions may be executable to adjust the gain of the amplifier based at least in part on the sound absorption characteristic of the surface.

In another aspect, an assembly includes at least one laser, at least one receiver configured to output signals representative of reflections of light emitted by the laser, and at least one computer storage. At least one processor is configured to access instructions on the computer storage to determine a distance to an object based at least in part on the signals from the receiver. The instructions are executable to establish a gain of at least one audio amplifier based at least in part on the distance.

The audio amplifier can be a microphone amplifier for communicating with the processor for receiving and amplifying voice signals from at least one microphone. In addition or alternatively, the audio amplifier can be a speaker amplifier for communicating with the processor for outputting signals to at least one audio speaker.

In another aspect, a method includes transmitting laser range-finding beams toward a person, and determining, using reflections of the beams, a distance to the person. The method includes using the distance to adjust a gain of an audio amplifier.

The details of the present application, both as to its structure and operation, can be best understood in reference to the accompanying drawings, in which like reference numerals refer to like parts, and in which:

DETAILED DESCRIPTION

Figure 1:
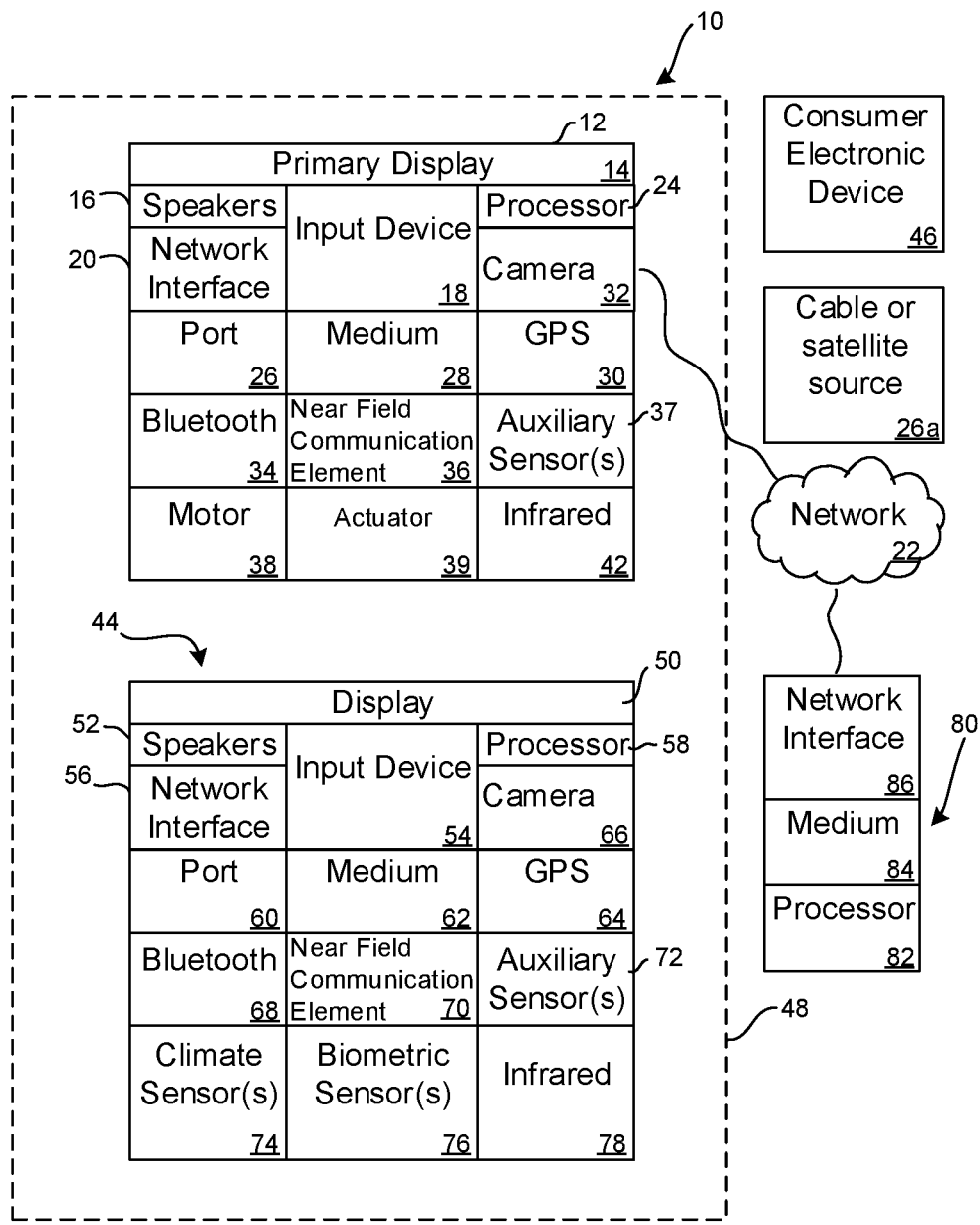
FIG. 1 is a block diagram of an example device.

This disclosure relates generally to computer ecosystems including aspects of multiple computerized devices. A system herein including computerized devices may include server and client components, connected over a network such that data may be exchanged between the client and server components. The client components may include one or more computing devices such as portable televisions (e.g. smart TVs, Internet-enabled TVs), portable computers such as laptops and tablet computers, and other mobile devices including smart phones and additional examples discussed below. These client devices may operate with a variety of operating environments. For example, some of the client computers may employ, as examples, operating systems. These operating environments may be used to execute one or more browsing programs that can access web applications hosted by the Internet servers discussed below.

Servers may include one or more processors executing instructions that configure the servers to receive and transmit data over a network such as the Internet. Or, a client and server can be connected over a local intranet or a virtual private network.

Information may be exchanged over a network between the clients and servers. To this end and for security, servers and/or clients can include firewalls, load balancers, temporary storages, and proxies, and other network infrastructure for reliability and security. One or more servers may form an apparatus that implement methods of providing a secure community including but not limited to social networks to network members.

As used herein, instructions refer to computer-implemented steps for processing information in the system. Instructions can be implemented in software, firmware or hardware and include any type of programmed step undertaken by components of the system.

A processor may be any conventional general purpose single- or multi-chip processor that can execute logic by means of various lines such as address lines, data lines, and control lines and registers and shift registers. A processor may be implemented by a digital signal processor (DSP), for example.

Software modules described by way of the flow charts and user interfaces herein can include various sub-routines, procedures, etc. Without limiting the disclosure, logic stated to be executed by a particular module can be redistributed to other software modules and/or combined together in a single module and/or made available in a shareable library.

Present principles described herein can be implemented as hardware, software, firmware, or combinations thereof; hence, illustrative components, blocks, modules, circuits, and steps are set forth in terms of their functionality.

Further to what has been alluded to above, logical blocks, modules, and circuits described below can be implemented or performed with a general purpose processor, a digital signal processor (DSP), a field programmable gate array (FPGA) or other programmable logic device such as an application specific integrated circuit (ASIC), discrete gate or transistor logic, discrete hardware components, or any combination thereof designed to perform the functions described herein. A processor can be implemented by a controller or state machine or a combination of computing devices.

The functions and methods described below, when implemented in software, can be written in an appropriate language such as but not limited to C# or C++, and can be stored on or transmitted through a computer-readable storage medium such as a random access memory (RAM), read-only memory (ROM), electrically erasable programmable read-only memory (EEPROM), compact disk read-only memory (CD-ROM) or other optical disk storage such as digital versatile disc (DVD), magnetic disk storage or other magnetic storage devices including removable thumb drives, etc. A connection may establish a computer-readable medium. Such connections can include, as examples, hard-wired cables including fiber optic and coaxial wires and digital subscriber line (DSL) and twisted pair wires.

Components included in one embodiment can be used in other embodiments in any appropriate combination. For example, any of the various components described herein and/or depicted in the Figures may be combined, interchanged or excluded from other embodiments.

"A system having at least one of A, B, and C" (likewise "a system having at least one of A, B, or C" and "a system having at least one of A, B, C") includes systems that have A alone, B alone, C alone, A and B together, A and C together, B and C together, and/or A, B, and C together, etc.

Now specifically referring to FIG. 1, an example system 10 is shown, which may include one or more of the example devices mentioned above and described further below in accordance with present principles. The first of the example devices included in the system 10 is an example computerized device 12.

The computerized device 12 may be an Android®-based system. The computerized device 12 alternatively may also include a computerized Internet enabled ("smart") telephone, a tablet computer, a notebook computer, a wearable computerized device such as e.g. computerized Internet-enabled watch, a computerized Internet-enabled bracelet, other computerized Internet-enabled devices, a computerized Internet-enabled music player, computerized Internet-enabled head phones, a computerized Internet-enabled implantable device such as an implantable skin device, etc. Regardless, it is to be understood that the computerized device 12 and/or other computers described herein is configured to undertake present principles (e.g. communicate with other CE devices to undertake present principles, execute the logic described herein, and perform any other functions and/or operations described herein).

Accordingly, to undertake such principles the computerized device 12 can be established by some or all of the components shown in FIG. 1. For example, the computerized device 12 can include one or more displays 14 that may be implemented by a high definition or ultra-high definition "4K" or higher flat screen and that may or may not be touch-enabled for receiving user input signals via touches on the display. The computerized device 12 may include one or more speakers 16 for outputting audio in accordance with present principles, and at least one additional input device 18 such as e.g. an audio receiver/microphone for receiving input sound including but not limited to audible commands to the computerized device 12 to control the computerized device 12. The example computerized device 12 may also include one or more network interfaces 20 for communication over at least one network 22 such as the Internet, a WAN, a LAN, a PAN etc. under control of one or more processors 24. Thus, the interface 20 may be, without limitation, a Wi-Fi transceiver, which is an example of a wireless computer network interface, such as but not limited to a mesh network transceiver. The interface 20 may be, without limitation a Bluetooth transceiver, Zigbee transceiver, IrDA transceiver, Wireless USB transceiver, wired USB, wired LAN, Powerline or MoCA. It is to be understood that the processor 24 controls the computerized device 12 to undertake present principles, including the other elements of the computerized device 12 described herein such as e.g. controlling the display 14 to present images thereon and receiving input therefrom. Furthermore, note the network interface 20 may be, e.g., a wired or wireless modem or router, or other appropriate interface such as, e.g., a wireless telephony transceiver, or Wi-Fi transceiver as mentioned above, etc.

In addition to the foregoing, the computerized device 12 may also include one or more input ports 26 such as, e.g., a high definition multimedia interface (HDMI) port or a USB port to physically connect (e.g. using a wired connection) to another CE device and/or a headphone port to connect headphones to the computerized device 12 for presentation of audio from the computerized device 12 to a user through the headphones. For example, the input port 26 may be connected via wire or wirelessly to a cable or satellite source 26a of audio video content. Thus, the source 26a may be, e.g., a separate or integrated set top box, or a satellite receiver. Or, the source 26a may be a game console or disk player containing content that might be regarded by a user as a favorite for channel assignment purposes described further below.

The computerized device 12 may further include one or more computer memories 28 such as disk-based or solid state storage that are not transitory signals, in some cases embodied in the chassis of the device as standalone devices or as a personal video recording device (PVR) or video disk player either internal or external to the chassis of the device for playing back AV programs or as removable memory media. Also in some embodiments, the computerized device 12 can include a position or location receiver such as but not limited to a cellphone receiver, GPS receiver and/or altimeter 30 that is configured to e.g. receive geographic position information from at least one satellite or cellphone tower and provide the information to the processor 24 and/or determine an altitude at which the computerized device 12 is disposed in conjunction with the processor 24. However, it is to be understood that that another suitable position receiver other than a cellphone receiver, GPS receiver and/or altimeter may be used in accordance with present principles to e.g. determine the location of the computerized device 12 in e.g. all three dimensions.

In some embodiments the computerized device 12 may include one or more cameras 32 that may be, e.g., a thermal imaging camera, a digital camera such as a webcam, and/or a camera integrated into the computerized device 12 and controllable by the processor 24 to gather pictures/images and/or video in accordance with present principles. Also included on the computerized device 12 may be a Bluetooth transceiver 34 and other Near Field Communication (NFC) element 36 for communication with other devices using Bluetooth and/or NFC technology, respectively. An example NFC element can be a radio frequency identification (RFID) element.

Further still, the computerized device 12 may include one or more auxiliary sensors 37 (e.g., a motion sensor such as an accelerometer, gyroscope, cyclometer, or a magnetic sensor, an infrared (IR) sensor for receiving IR commands or other signals from a remote control or laser, an optical sensor, a speed and/or cadence sensor, a gesture sensor (e.g. for sensing gesture command), etc.) providing input to the processor 24. The computerized device 12 may include one or more motors 38, which may be a battery-powered motor, and one or more actuators 39 coupled to the motor 38 and configured to cause the device 12 to ambulate. In one example, the actuator 39 is a simple axle-and-wheel actuator that can be energized by the motor 38 to cause the device 12 to roll across a surface. In another example the actuator 39 may include one or more linear actuators with joints to cause the device 12 to move in a robotic, walking-type fashion on multiple legs. These are but two examples of motion actuators that can be included in the device 12.

In addition to the foregoing, it is noted that the computerized device 12 may also include an infrared (IR) transmitter and/or IR receiver and/or IR transceiver 42 such as a laser or an IR data association (IRDA) device. A battery (not shown) may be provided for powering the computerized device 12.

Still referring to FIG. 1, in addition to the computerized device 12, the system 10 may include one or more other computer device types that may include some or all of the components shown for the computerized device 12 and that may wirelessly communicate with the device 12 to control it. In one example, a first device 44 and a second device 46 are shown and may include similar components as some or all of the components of the computerized device 12. Fewer or greater devices may be used than shown.

In the example shown, to illustrate present principles all three devices 12, 44, 46 are assumed to be members of a local network in, e.g., a dwelling 48, illustrated by dashed lines.

The example non-limiting first device 44 may include one or more touch-sensitive surfaces 50 such as a touch-enabled video display for receiving user input signals via touches on the display. The first device 44 may include one or more speakers 52 for outputting audio in accordance with present principles, and at least one additional input device 54 such as e.g. an audio receiver/microphone for e.g. entering audible commands to the first device 44 to control the device 44. The example first device 44 may also include one or more network interfaces 56 for communication over the network 22 under control of one or more processors 58. Thus, the interface 56 may be, without limitation, a Wi-Fi transceiver, which is an example of a wireless computer network interface, including mesh network interfaces. It is to be understood that the processor 58 controls the first device 44 to undertake present principles, including the other elements of the first device 44 described herein such as e.g. controlling the display 50 to present images thereon and receiving input therefrom. Furthermore, note the network interface 56 may be, e.g., a wired or wireless modem or router, or other appropriate interface such as, e.g., a wireless telephony transceiver, or Wi-Fi transceiver as mentioned above, etc.

In addition to the foregoing, the first device 44 may also include one or more input ports 60 such as, e.g., a HDMI port or a USB port to physically connect (e.g. using a wired connection) to another computer device and/or a headphone port to connect headphones to the first device 44 for presentation of audio from the first device 44 to a user through the headphones. The first device 44 may further include one or more tangible computer readable storage medium 62 such as disk-based or solid state storage. Also in some embodiments, the first device 44 can include a position or location receiver such as but not limited to a cellphone and/or GPS receiver and/or altimeter 64 that is configured to e.g. receive geographic position information from at least one satellite and/or cell tower, using triangulation, and provide the information to the device processor 58 and/or determine an altitude at which the first device 44 is disposed in conjunction with the device processor 58. However, it is to be understood that that another suitable position receiver other than a cellphone and/or GPS receiver and/or altimeter may be used in accordance with present principles to e.g. determine the location of the first device 44 in e.g. all three dimensions.

Continuing the description of the first device 44, in some embodiments the first device 44 may include one or more cameras 66 that may be, e.g., a thermal imaging camera, a digital camera such as a webcam, etc. Also included on the first device 44 may be a Bluetooth transceiver 68 and other Near Field Communication (NFC) element 70 for communication with other devices using Bluetooth and/or NFC technology, respectively. An example NFC element can be a radio frequency identification (RFID) element.

Further still, the first device 44 may include one or more auxiliary sensors 72 (e.g., a motion sensor such as an accelerometer, gyroscope, cyclometer, or a magnetic sensor, an infrared (IR) sensor, an optical sensor, a speed and/or cadence sensor, a gesture sensor (e.g. for sensing gesture command), etc.) providing input to the CE device processor 58. The first device 44 may include still other sensors such as e.g. one or more climate sensors 74 (e.g. barometers, humidity sensors, wind sensors, light sensors, temperature sensors, etc.) and/or one or more biometric sensors 76 providing input to the device processor 58. In addition to the foregoing, it is noted that in some embodiments the first device 44 may also include an infrared (IR) transmitter and/or IR receiver and/or IR transceiver 42 such as a laser or an IR data association (IRDA) device. A battery may be provided for powering the first device 44. The device 44 may communicate with the computerized device 12 through any of the above-described communication modes and related components.

The second device 46 may include some or all of the components described above.

Now in reference to the afore-mentioned at least one server 80, it includes at least one server processor 82, at least one computer memory 84 such as disk-based or solid state storage, and at least one network interface 86 that, under control of the server processor 82, allows for communication with the other devices of FIG. 1 over the network 22, and indeed may facilitate communication between servers, controllers, and client devices in accordance with present principles. Note that the network interface 86 may be, e.g., a wired or wireless modem or router, Wi-Fi transceiver, or other appropriate interface such as, e.g., a wireless telephony transceiver.

Accordingly, in some embodiments the server 80 may be an Internet server, and may include and perform "cloud" functions such that the devices of the system 10 may access a "cloud" environment via the server 80 in example embodiments. Or, the server 80 may be implemented by a game console or other computer in the same room as the other devices shown in FIG. 1 or nearby.

Before proceeding to example embodiments in FIGS. 2-9, in which multiple computerized devices map each other in their respective areas, it is to be understood that the illustrated system is but an example of one environment in which the acoustic-based direction of arrival (DoA) principles discussed herein to aim time of flight (ToF) based laser range finding systems may be used. The acoustic-based DoA principles discussed herein to aim ToF-based laser range finding systems may be used in other embodiments as well, such as acoustic/ultrasonic range finding systems and camera-based range finding systems that might use, e.g., phase detection.

Figure 2:
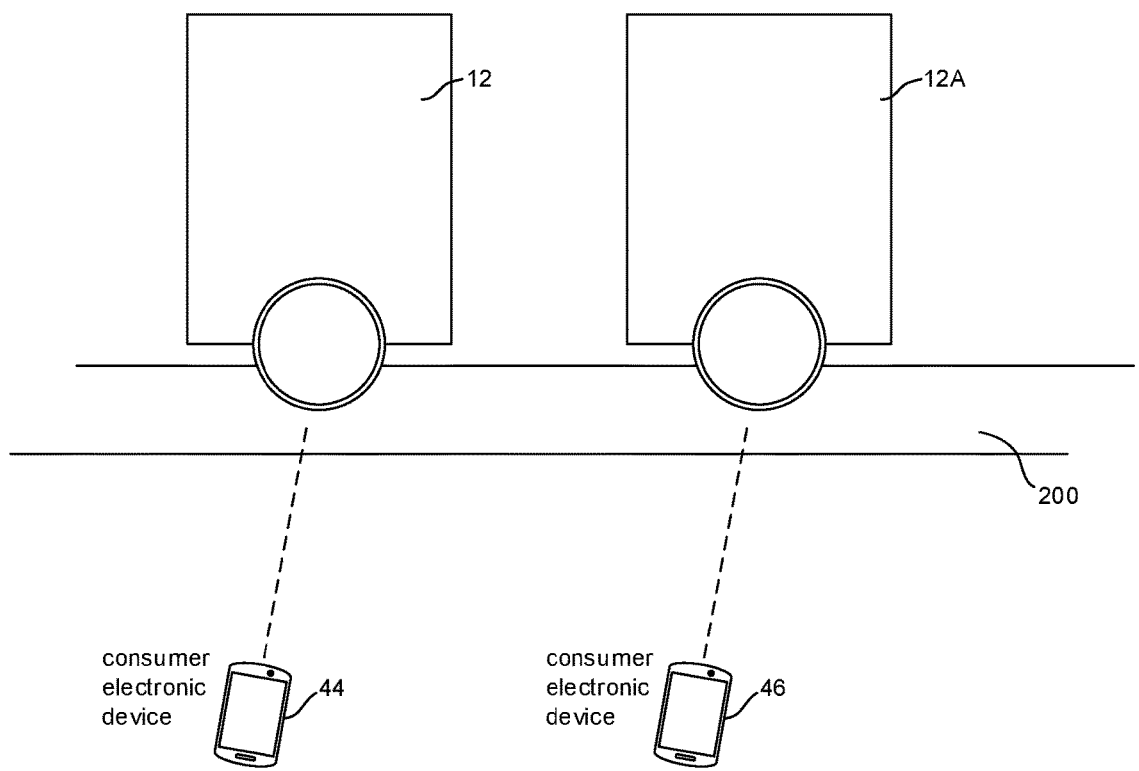
FIG. 2 is a block diagram of a system showing two devices, it being understood that more than two devices may be used.

FIG. 2 shows that multiple devices 12, 12A may be controlled by respective CE devices 44, 46 to interact on a surface 200 such as a flat planar surface.

Figure 3:
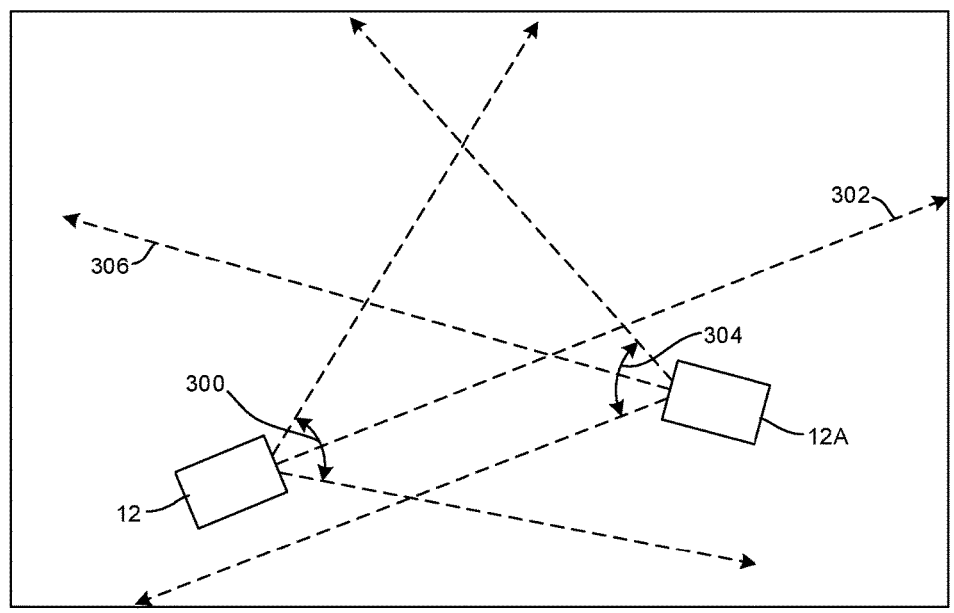
FIG. 3 is a schematic top view of two devices showing field of view of the devices.

FIG. 3 shows that the first device 12 may have a camera providing a field of view (FOV) with a FOV angle 300. The first device 12 may emit laser range-finding light such as IR light along one or more range finding axes 302. The camera may be implemented by a complementary metal oxide semiconductor (CMOS) camera that can detect both visible and infrared light so as to be able to produce still or video images along with detections of laser reflections for purposes of generating a depth map.

Likewise, the second device 12A may have a camera providing a field of view (FOV) with a FOV angle 304. The first device 12 may emit laser range-finding light such as IR light along one or more range finding axes 306. More than two devices may be used. In the example shown, each device is within the FOV of the other device, and the FOVs of the devices overlap as shown. The devices 12, 12A emitting their respective laser beams establish an optical micro-mesh.

Figure 4:
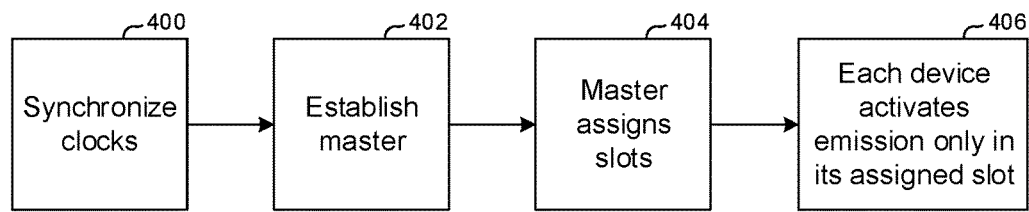
FIG. 4 is a flow chart of example general logic according to present principles.

FIG. 4 shows example general logic. Commencing at state 400, internal computer clocks of the devices 12, 12A are synchronized with each other. This can be done by synchronizing the clocks to a common "heartbeat" such as a master clock that may be the clock of any of the master devices discussed below, or other clock.

At block 402 a master device is established. Examples of how this may be done are discussed below. The master device may be a system server that communicates with the devices, or a controller such as the CE device 44, or one of the peer devices 12, 12A. The matter device may assign time slots in a transmission schedule to each device at block 404, and then each device activates its emission (such as a laser range-finding emission) at block 406 only in a period defined by one of its assigned slots in the schedule.

Figure 5:
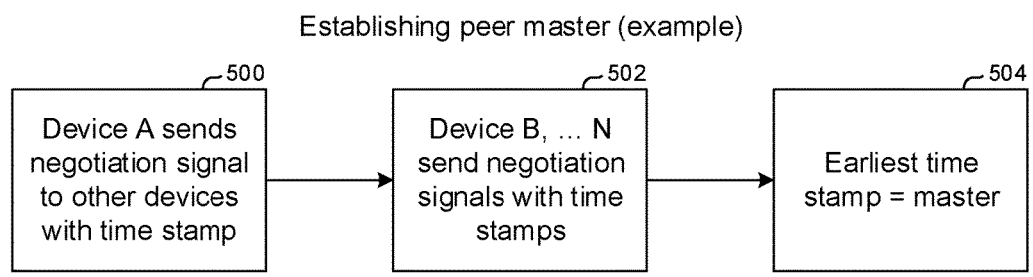
FIG. 5 is a flow chart of example logic for establishing a peer device as a master device.

FIG. 5 illustrates example logic when one of the peer devices 12, 12A is to be a master. A first one of the devices ("A") sends a negotiation signal at block 500 to the other devices, time-stamping the transmission time in a "let's establish a master" message carried in the signal. The signal may be sent via Wi-Fi, Bluetooth, laser, or other transmission means. Other devices ("B, . . . N") may also send time-stamped negotiation signals at block 502. At block 504, the devices access the timestamps of their messages and the messages of the other devices, and the device whose message carries the earliest time stamp can be acknowledged, by each device, as the master device at block 504.

Figure 6:
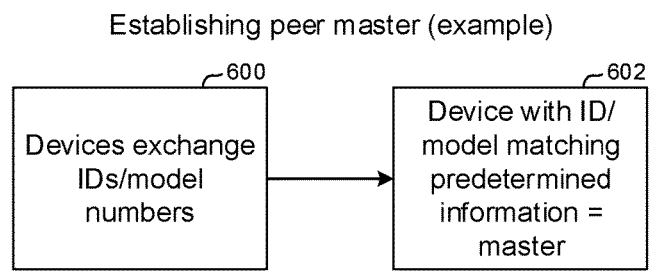
FIG. 6 is a flow chart of example alternate logic for establishing a peer device as a master device.

Alternatively, at block 600 in FIG. 6 each device 12, 12A . . . can send identification information such serial number and/or model number and/or manufacturer name to other devices. At block 602 the device with its identification information matching a predetermined information can be acknowledged, by each device, as the master device.

Figure 7:
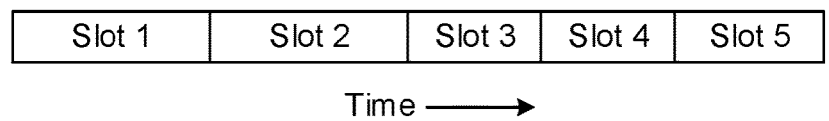
FIG. 7 is a schematic diagram of an example transmission schedule.

FIG. 7 shows an example transmission schedule that is divided into sequential time slots each of which may have the same temporal length as the other slots, or a different length than the other slots. These slots can be assigned to respective devices at block 404 in FIG. 4 by the master device. It is to be understood that the transmission schedule may start at an initial time defined by the system "heartbeat" and that the time slots repeat, so that each device is typically assigned multiple time slots separated from each other by the time slots of the other devices.

Figure 8:
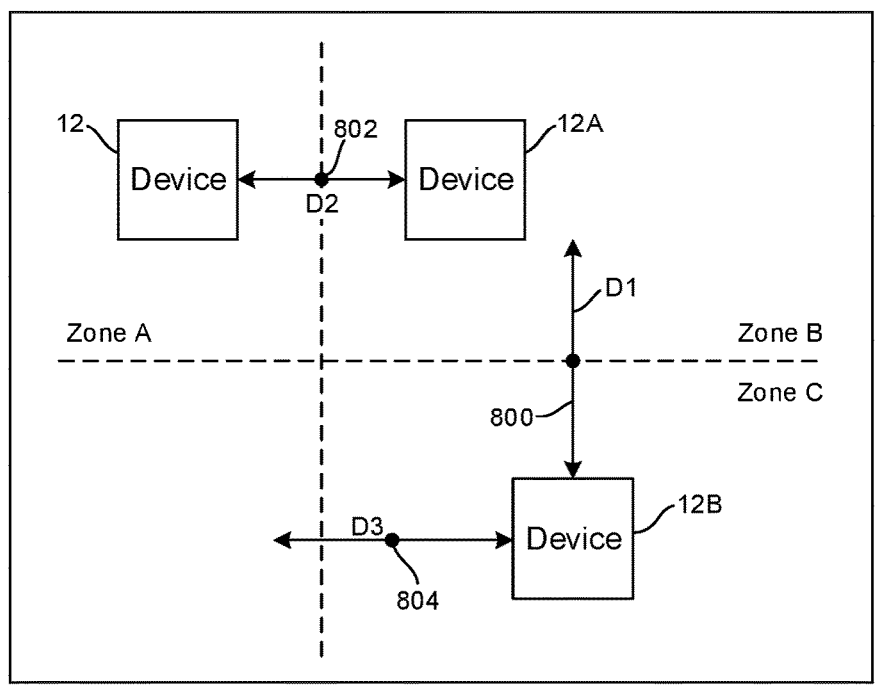
FIG. 8 is an example schematic plan view of multiple devices illustrating a space division interference-avoidance technique.

FIG. 8 illustrates that in lieu of (or in addition to) using time division multiplexing (TDM) as in FIGS. 4-7 to alleviate mutual interference due to overlapping emissions of laser illumination, space division (SD) may be used to alleviate mutual interference. In FIG. 8, as an example, three devices 12, 12A, and 12B are assigned respective spatial zones A, B, and C. The zones may be static, with the devices 12, 12A, and 12B being restricted to remaining within their zones. Or, the zones may be dynamic and may change as the devices move, e.g., on a common flat surface. As an example of the latter, suppose the distance along the y-axis between the devices 12A and 12B is D1, with the midpoint being at 800. A horizontal boundary represented by the dashed line may be established by a perpendicular to the distance vector that passes through the midpoint 800.

Similarly, if the distance D2 along the x-axis between the devices 12 and 12A is D2 with midpoint 802, a vertical boundary represented by the dashed line may be established by a perpendicular to the distance vector that passes through the midpoint 802. The zones A, B, and C are defined by the boundaries. Because the distance D3 along the x-axis between the devices 12 and 12B is greater than the distance D2 between the devices 12 and 12A, its midpoint 804 is not used to define a boundary. In other implementations the midpoint of the greater distance may be used. Other points along the distance vector than the midpoint may be used. In any case, it will be appreciated that as a device moves, the boundaries defining the zones may also move and, hence, the sizes of the zones can change dynamically.

Figure 9:
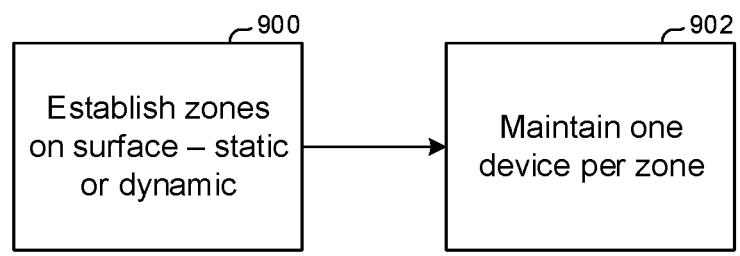
FIG. 9 is a flow chart of example logic attendant to the technique in FIG. 8.

FIG. 9 illustrates to block 900 that the zones shown in FIG. 8 are established and remain static or change dynamically as disclosed. The zones may be established by, e.g., a master device such as any of the above-described master devices. At block 902 when the devices can move, each device is constrained to remain within its assigned spatial zone.

Figure 10:
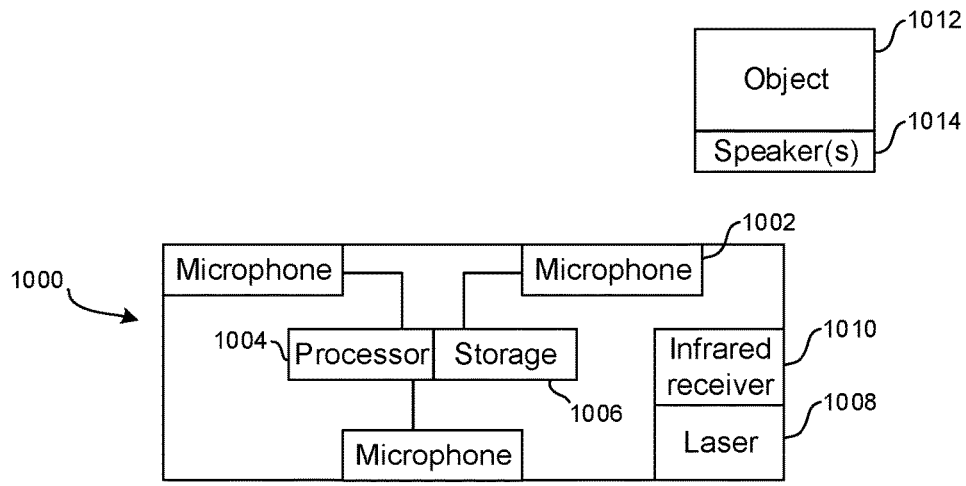
FIG. 10 is a schematic plan view of a computerized range-finding and mapping device using sound from an object to direct a laser range finder toward the object.
Figure 11:
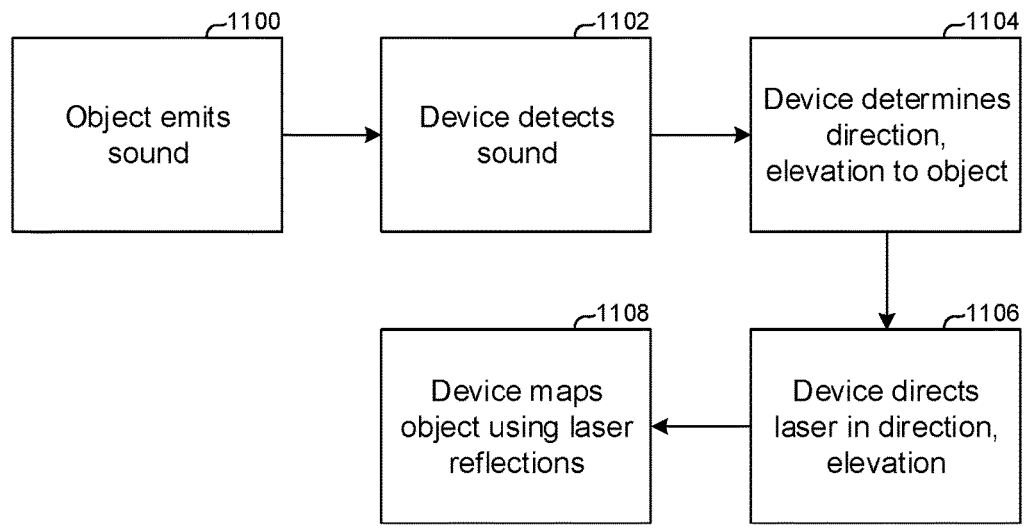
FIG. 11 is a flow chart of logic consistent with present principles.

FIGS. 10 and 11 illustrate additional features that may be used with the technology in FIGS. 1-9 or in other systems to efficiently conduct laser-based ToF range-finding to objects. A computerized device 1000 that may be implemented by any appropriate one of the devices described previously and that may include any of the internal components described previously can include one or more microphones 1002. The device 1000 includes at least one and in the example shown, plural microphones 1002 arranged in an array. In one embodiment at least one microphone 1002 may be a directional microphone such as a so-called "shotgun" microphone that directly outputs an indication of the direction in which received sound was detected. In other embodiments a multi-microphone array is used. In the example, three microphones 1002 are arranged at vertices of a triangle. In other embodiments, two and only two microphones 1002 may be provided. When two and only two microphones 1002 are provided, they may be spaced laterally from each other in the x-y (azimuthal) plane and may be offset from each other in the z-dimension (elevational dimension). The microphones 1002 may be ultrasonic microphones in some embodiments.

The microphones 1002 may communicate via wired and/or wireless paths with at least one processor 1004 accessing instructions on a computer storage 1006. The processor 1004 may control one or more lasers 1008 such as infrared (IR) lasers to emit light toward objects, with reflections of the light from the objects being detected by a receiver 1010 that communicates with the processor 1004. Based on the time difference between transmission of the laser light and receipt of the return reflection and speed of light, the processor 1004 can determine the range to objects reflecting the laser light.

Thus, one or more objects 1012 may be irradiated by the laser light and may reflect the light back to the receiver 1010. The objects 1012 may emit sound. The objects 1012 may be people, in which case the sound they emit may be spoken voices, or other computerized devices, in which case they typically include one or more speakers 1014 for emitting sound. In some embodiments, the speakers 1014 may be ultrasonic (US) speakers, so that the acoustic-based direction of arrival (DoA) principles discussed below may be imperceptible to humans. However, human-perceptible sound may also be used.

FIG. 11 illustrates example logic for using an acoustic-based DoA system such as the example system shown in FIG. 10 to determine the direction of incoming sound, such as from an object 1012 talking or emitting sound from its speakers 1014, to focus a laser-based ToF system such as the example system shown in FIG. 10 to narrow the area of laser illumination, thereby improving the signal to noise ratio. The DoA system may also provide elevation information pertaining to the source of the sound, to further narrow the required field of view of the laser ToF system.

With more specificity, at block 1100 the object 1012 emits sound. When the object is a person the person may emit sound by speaking. When the object is a computerized device, the object may emit sound by emitting a sound such as a US pulse or other sonic frequency sound pattern on its speaker(s) 1014. In the context of the non-limiting system of FIGS. 2-9, if desired the object 1012 may emit a sonic pattern according to a schedule known to all the computerized devices, so that all the devices know the identity of the emitting object. In addition or alternatively, the object may emit sound including a sonic code that uniquely identifies the object.

Moving to block 1102, the device 1000 detects the sound emitted at block 1100. Proceeding to block 1104, based on the detected sound, the device 1000 (e.g., the processor 1004) determines the direction along which the sound was received and, hence, the direction of the object 1012 relative to the device 1000, which essentially establishes an origin.

To do this, the device 1000 may simply note the indication of sound direction from the microphone 1002 when the microphone 1002 is a directional microphone. When an array of omnidirectional microphones is used, the processor 1004 may note the delays between times of reception of the sound at the various microphones and converting the delays to distances using the relationship between the speed of sound, time, and distance. The distances can then be triangulated to determine the azimuthal direction to the object 1012 from the device 1100, and furthermore when microphones in the array are elevationally offset from each other, the elevational direction of the object 1012 may also be determined.

Once having determined the direction of the object 1012 in azimuth and, if desired, in elevation as well using acoustics as described above, the logic moves to block 1106 to direct the light from the laser 1008 in the direction determined at block 1104. To do this, the laser 1008 can be mounted on a gimbal or other movable mount which is controlled by the processor 1004 to turn to the direction determined at block 1104, with laser range-finding light being emitted along the direction. Or, the laser 1008 may be stationarily mounted on the device 1000 and the processor 1004 may cause the entire device to turn as appropriate to aim the laser 1008 along the direction determined at block 1004. At block 1108, using ToF principles discussed previously, the device determines the range to the object 1012 based on the time difference between laser transmission and laser reflection reception, also mapping the object 1012 in relative space if desired using the laser-derived range from block 1108 and sonic-derived direction to the object from block 1104. Note that to conserve power, the laser 1008 may not be activated unless and until a sonic-derived direction to an object 1012 is determined and used to aim the laser at the object.

Figure 12:
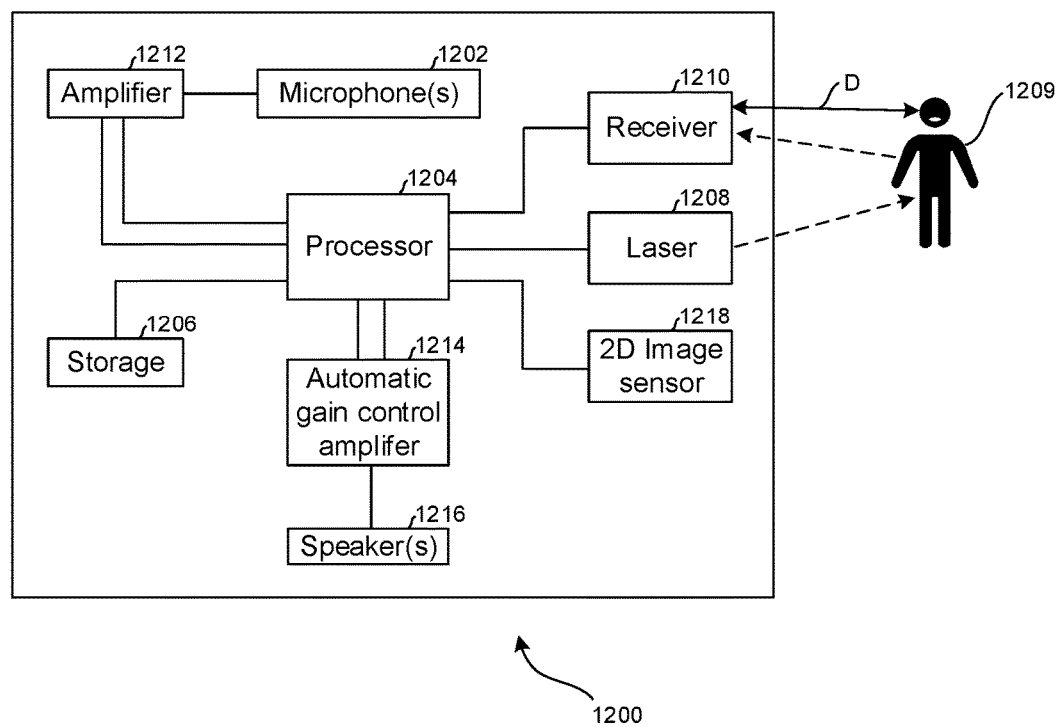
FIG. 12 is a block diagram of an example computerized range-finding device with an audio amplifier that has its gain adjusted based on the range to the person speaking as determined by the laser-based ToF system.
Figure 13:
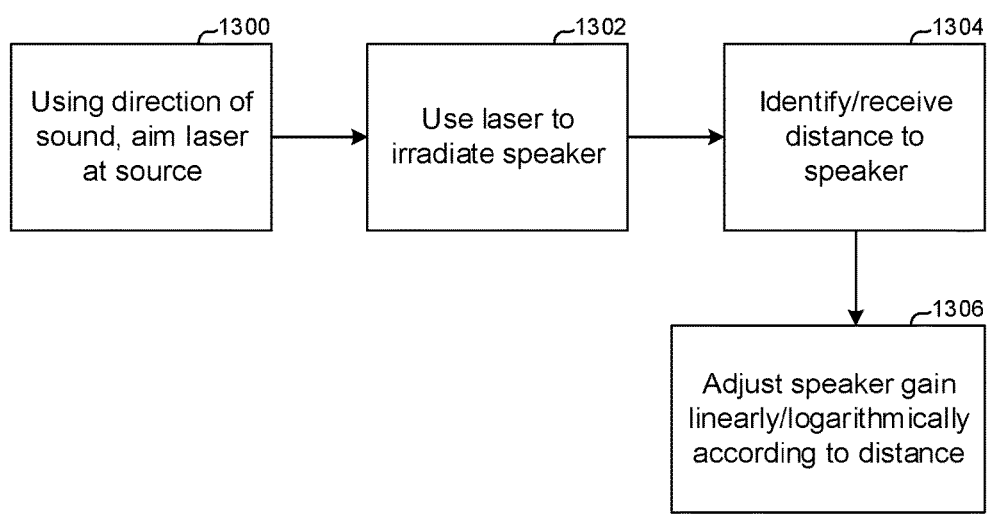
FIG. 13 is a flow chart consistent with present principles.

FIGS. 12 and 13 illustrate the use of laser range-finding to adjust the gain of one or more audio amplifiers. In FIG. 12, a computerized device 1200 that may be implemented by any appropriate one of the devices described previously and that may include any of the internal components described previously can include one or more microphones 1202. The device 1200 includes at least one and in some embodiments plural microphones 12002 arranged in an array. In one embodiment at least one microphone 12002 may be a directional microphone such as a so-called "shotgun" microphone that directly outputs an indication of the direction in which received sound was detected. In other embodiments a multi-microphone array is used. In an example, three microphones 1202 may be arranged at vertices of a triangle. In other embodiments, two and only two microphones 1202 may be provided. When two and only two microphones 1202 are provided, they may be spaced laterally from each other in the x-y (azimuthal) plane and may be offset from each other in the z-dimension (elevational dimension). The microphones 1202 may be ultrasonic microphones in some embodiments.

The microphones 1202 may communicate via wired and/or wireless paths with at least one processor 1204 accessing instructions on a computer storage 1206. The processor 1204 may control one or more lasers 1208 such as infrared (IR) lasers to emit light toward objects such a person 1209 who may be speaking, with reflections of the light from the object being detected by a receiver 1210 that communicates with the processor 1204. Based on the time difference between transmission of the laser light and receipt of the return reflection and speed of light, the processor 1204 can determine the range or distance "D" to the person 1209 reflecting the laser light. The distance "D" is thus a distance between the irradiated object and a reference origin, in this case, the receiver 1210, which for present purposes can be taken to represent the distance between the person 1209 and the microphones 1202.

Thus, one or more objects may be irradiated by the laser light and may reflect the light back to the receiver 1210. The objects 1209 may be people, in which case the sound they emit may be spoken voices, or the irradiated object may be other computerized devices.

In the example embodiment shown, signals from the microphone 1202 may be amplified by one or more microphone amplifiers 1212, which may in turn send the amplified signals to the processor 1204 and receive automatic gain control (AGC) signals from the processor 1204 over one or more communication paths that cause the amplifier 1212 to adjust its gain up or down. Likewise, one or more speaker amplifiers 1214 may be provided that receive signals from the processor 1204 over one or more communication paths and output amplified signals to one or more speakers 1216 associated with the device 1200 (e.g., by being on or in communication with the device 1200). In some examples, in addition to or in lieu of the laser range-finding system, the device 1200 may include one or more image sensors 1218 such as a two dimensional imager implemented by a complementary metal-oxide-semiconductor (CMOS) device or charge-coupled device (CCD).

Now referring to FIG. 13, example operation of the device 1200 shown in FIG. 12 is explained. Commencing at block 1300, in some non-limiting embodiments the acoustic-based DoA principles discussed above may be used to determine the direction of the person 1209. Proceeding to block 1302, using the direction provided by the acoustic-based DoA system, the laser 1208 may be aimed as described above toward the person 1209 and activated to cause a reflection from the person 1209 to be received by the receiver 1210.

Moving to block 1304, the processor 1204 may next determine the distance "D" to the person 1209 as described above using the laser-based ToF principles already discussed. Then, at block 1306 the processor 1204 may adjust or otherwise establish the gain of either one or both of the microphone amplifier 1212 or speaker amplifier 1214 based on the distance "D" determined at block 1304.

In some examples, the amplifier gain adjustment(s) may be linearly correlated to the distance "D". For instance, suppose the gain of the amplifier to be adjusted as at some nominal reference gain$_{ref}$ when the distance "D" is equal to a reference distance $D_{ref}$. The gain at a non-reference distance "D" may be determined by, for example:

$$Gain = gain_{ref}(D/D_{ref})$$

In other examples, the amplifier gain adjustment(s) may be logarithmically correlated to the distance "D", for example:

$$Gain = gain_{ref} 10 \log D/D_{ref}$$

Table lookups correlating various values of "D" and "gain" may be used in lieu of the above algorithms for speed, if desired, with the table entry of the "D" nearest the laser-measured "D" being used to extract the corresponding gain.

Thus, the processor's ability to execute voice recognition on speech from the person 1209 for example is improved. Instead of adapting the gain level by trying a setting, detecting speech and the either raising or lowering the gain in an iterative process, the above-described laser-based ToF principles (augmented if desired by the above-described DoA principles to aim the laser) can be used to provide ancillary information.

Additionally, not only can the ToF system determine range to the person, but as described previously it can generate a 3D map of the person's face, which may be input to a face recognition algorithm to determine the identity of the person and/or identify that the person being imaged is speaking, thereby confirming that the distance to the person is indeed that which should be used to adjust the audio amplifier gain.

As an alternative to determining the distance "D" using ToF calculations, the laser-based ToF system may simply determine the speakers' distance by determining, from the 3D map, the angle between the pupils, intraocular spacing being relatively standard amongst humans, and correlate the intraocular spacing to a distance to the person. If desired, the 2D image sensor 1218 may be used for this same purpose.

The resolution of the 3D TOF system and/or 2D camera system may be great enough to detect surface textures of the objects in the room. Based upon the type of surface texture, the approximate sound absorptive properties of the object/surface can be determined using, e.g., a table look-up correlating surface texture types with acoustic absorption properties. For example, texture types that may be discerned from a high resolution 3D TOF system and/or 2D camera system may be whether a ceiling is acoustic tile, or a floor is a shag carpet or hardwood, or a wall is wood or wall paper or tile.

Based upon the acoustical properties of the various textured surfaces in the room, it may be determined whether the room is acoustically reflective or absorptive. The acoustical absorption properties of objects in the path between the microphone and person also can be used to adjust the gain. As an example, if a room's surfaces and objects are primarily acoustically reflective, gain can be reduced for better echo cancellation, whereas if a room's surfaces and objects are primarily absorptive of sound, gain can be increased to better amplify the person's voice.

While particular techniques and machines are herein shown and described in detail, it is to be understood that the subject matter which is encompassed by the present invention is limited only by the claims.

What is claimed is:

1. A device comprising:
at least one computer medium that is not a transitory signal and that comprises instructions executable by at least one processor to:
receive from at least on microphone at least a first acoustic signal from a source of sound;
determine at least an azimuthal direction to the source of sound from an origin based at least in part on the first acoustic signal;
transmit at least a first range-finding beam along the azimuthal direction determined based at least in part on the first acoustic signal to render a distance to the source of sound;
based at least in part on the distance rendered using the range-finding beam, adjust a gain of an amplifier of an audio system;
identify a sound absorption characteristic of a surface; and
adjust the gain of the amplifier based at least in part on the sound absorption characteristic of the surface.

2. The device of claim 1, comprising the at least one processor.

3. The device of claim 1, wherein the gain of the amplifier is linearly correlated to the distance.

4. The device of claim 1, wherein the gain of the amplifier is logarithmically correlated to the distance.

5. The device of claim 1, wherein the distance rendered using the laser range-finding beam is based on intraocular spacing between a person's pupils as determined from a 3D map generated based on reflections of the laser range-finding beam.

6. The device of claim 1, wherein identifying the sound absorption characteristic of the surface comprises:
determining, based on a texture of the surface, the sound absorption characteristic of the surface.

7. The device of claim 1, wherein the instructions are executable to determine at least an elevational direction to the source of sound from the origin based at least in part on the first acoustic signal.

8. The device of claim 1, wherein the instructions are executable to determine a range to the object based on a time of transmission of the first laser range-finding beam and a time of reception of a reflection of the first laser range-finding beam.

9. An assembly comprising:
at least one laser;
at least one receiver configured to output signals representative of reflections of light emitted by the laser;
at least one computer storage; and
at least one processor configured to access instructions on the computer storage to:
receive at least a first acoustic signal from the object;
determine at least an azimuthal direction to the object from an origin based at least in part on the first acoustic signal;
transmit at least a first laser range-finding beam along the azimuthal direction;
determine a distance to an object based at least in part on the signals from the receiver; and
establish a gain of at least one audio amplifier based at least in part on the distance and a sound absorption characteristic of the object.

10. The assembly of claim 9, wherein the audio amplifier is a microphone amplifier for communicating with the processor for receiving and amplifying voice signals from at least one microphone.

11. The assembly of claim 9, wherein the audio amplifier is a speaker amplifier for communicating with the processor for outputting signals to at least one audio speaker.

12. The assembly of claim 9, wherein the distance rendered based on intraocular spacing between a person's pupils as determined from a 3D map generated based on reflections of light emitted by the laser.

13. The assembly of claim 9, wherein the distance is based on a time of flight (ToF) determination.

14. A computer-implemented method comprising:
transmitting laser range-finding beams toward a person, a direction to the person being identified least in part on detecting a signal from the person representing the direction to the person;
determining, using reflections of the beams, a distance to the person;
identifying a sound absorption characteristic of the person; and
using the distance and sound absorption characteristic, adjusting a gain of an audio amplifier.

15. The method of claim 14, comprising:
determining at least an azimuthal direction to the object based on sound received from the object; and
aiming the laser range-finding beams according to the azimuthal direction.

16. The method of claim 14, wherein the audio amplifier is a microphone amplifier for receiving and amplifying voice signals from at least one microphone.

17. The method of claim 14, wherein the audio amplifier is a speaker amplifier for outputting signals to at least one audio speaker.

18. The method of claim 14, comprising linearly correlating the gain of the audio amplifier to the distance.

19. The method of claim 14, comprising logarithmically correlating the gain of the audio amplifier to the distance.

* * * * *